United States Patent [19]

Pavio, Jr.

[11] Patent Number: 4,751,744

[45] Date of Patent: Jun. 14, 1988

[54] MONOLITHIC DISTRIBUTED MIXER

[75] Inventor: Anthony M. Pavio, Jr., Plano, Tex.

[73] Assignee: Texas Instruments Incorporated, Dallas, Tex.

[21] Appl. No.: 737,770

[22] Filed: May 28, 1985

[51] Int. Cl.<sup>4</sup> ............................ H04B 1/28; H04B 1/26
[52] U.S. Cl. .................................. 455/333; 455/325; 455/326; 330/54
[58] Field of Search ............... 455/332, 333, 325, 326; 332/43 B; 330/54, 53

[56] References Cited

U.S. PATENT DOCUMENTS

| | | | |
|---|---|---|---|
| 2,957,143 | 10/1960 | Enloe | 330/54 |
| 2,978,579 | 4/1961 | Sosin | 330/54 |
| 4,337,439 | 6/1982 | Sosin | 330/54 |
| 4,369,522 | 1/1983 | Cerny, Jr. et al. | 455/333 |
| 4,486,719 | 12/1984 | Ayasli | 330/54 |
| 4,540,954 | 9/1985 | Apel | 330/54 |
| 4,564,817 | 1/1986 | Gilson et al. | 330/54 |
| 4,595,881 | 6/1986 | Kennan | 330/54 |
| 4,662,000 | 4/1987 | Tajima et al. | 455/326 |

FOREIGN PATENT DOCUMENTS 196098A 10/1986 European Pat. Off. ............ 455/325

OTHER PUBLICATIONS

Tsironis et al., "Dual-Gate MESFET Mixers", Mar. 1984, pp. 248–255.
Kennan et al., A Miniature 2–18 GHz Monolithic GaAs Distributed Amplifier, 1984, pp. 41–44.

Primary Examiner—Robert L. Griffin
Assistant Examiner—Curtis Kuntz
Attorney, Agent, or Firm—James T. Comfort; Richard K. Robinson; Melvin Sharp

[57] ABSTRACT

A monolithic distributed mixer includes a plurality of dual gate field effect transistors (FETs) and first and second corresponding pluralities of T shaped constant K-filters connected respectively to first and second gates of the dual gate FETs for delaying in time the LO and RF voltages applied thereto whereby the phase shift is the same at each filter and the phase difference between the LO and RF at each FET is equal. Thus, the IF energy developed at each drain is in phase. The plurality of dual gate FETs have their drains commonly connected for summing the IF outputs thereof to provide a flat response throughout the bandwidth which is limited only by the cutoff voltages of the FETs or first and second pluralities of K-filters which act as low pass filters.

5 Claims, 3 Drawing Sheets 4,751,744

MONOLITHIC DISTRIBUTED MIXER

BACKGROUND OF THE INVENTION

This invention relates to monolithic electronic circuits and more particularly to a distributed mixer.

In the past mixer techniques have included single or dual gate field effect transistors (FETs) used in numerous types of configurations ranging from single ended to dual balanced rings. Nevertheless, none of the techniques have achieved broadband performance, and this includes circuits employing external baluns and multiple devices. The use of baluns provides the best performance of all, but they cannot be implemented using monolithic circuit fabrication methods.

There are also other circuit constraints limiting the performance of single or dual gate FET mixers. With single gate devices, it is difficult, even with baluns, to inject the required local oscillator (LO) energy needed for operation. Broadband performance is also difficult to achieve owing to the wide impedance variations encountered at the gate and drain of any FET. The LO injection problem is eliminated with the dual gate FET, but impedance matching and stability problems still exist.

SUMMARY OF THE INVENTION

Accordingly, it is an object of this invention to provide a monolithic mixer having broadband performance.

Another object of the invention is to provide a monolithic mixer which is stable in operation.

A further object of the invention is to provide a monolithic mixer having improved impedance matching characteristics.

Briefly stated the invention comprises a monolithic distributed mixer which employs a traveling wave structure to alleviate any bandwidth and impedance matching problems. The traveling wave structure includes lumped element transmission lines connected to dual gate type active elements formed in a common substrate. Although distributed amplifiers require transmission line structures on the drain sides of the FETs, this requirement is eliminated in the traveling wave mixer by correctly designing the input transmission lines. If the phase shift, as a function of frequency, is the same at each corresponding section of transmission line, the phase difference between f1 and f2 at each active device is equal. Thus, the IF energy developed at each drain will be in phase and hence can be summed with a simple impedance matching network.

With the monolithic distributed wave mixer, operation over a very large bandwidth is possible. Thus a variety of receiver functions for EW systems are made possible on a single chip, such as, for example, phase tracking RF converters and broadband up converters.

Other objects and features of the invention will become more readily apparent from the following detailed description when read in conjunction with the accompanying drawings, in which:

DESCRIPTION OF THE PREFERRED EMBODIMENT

Figure 1:
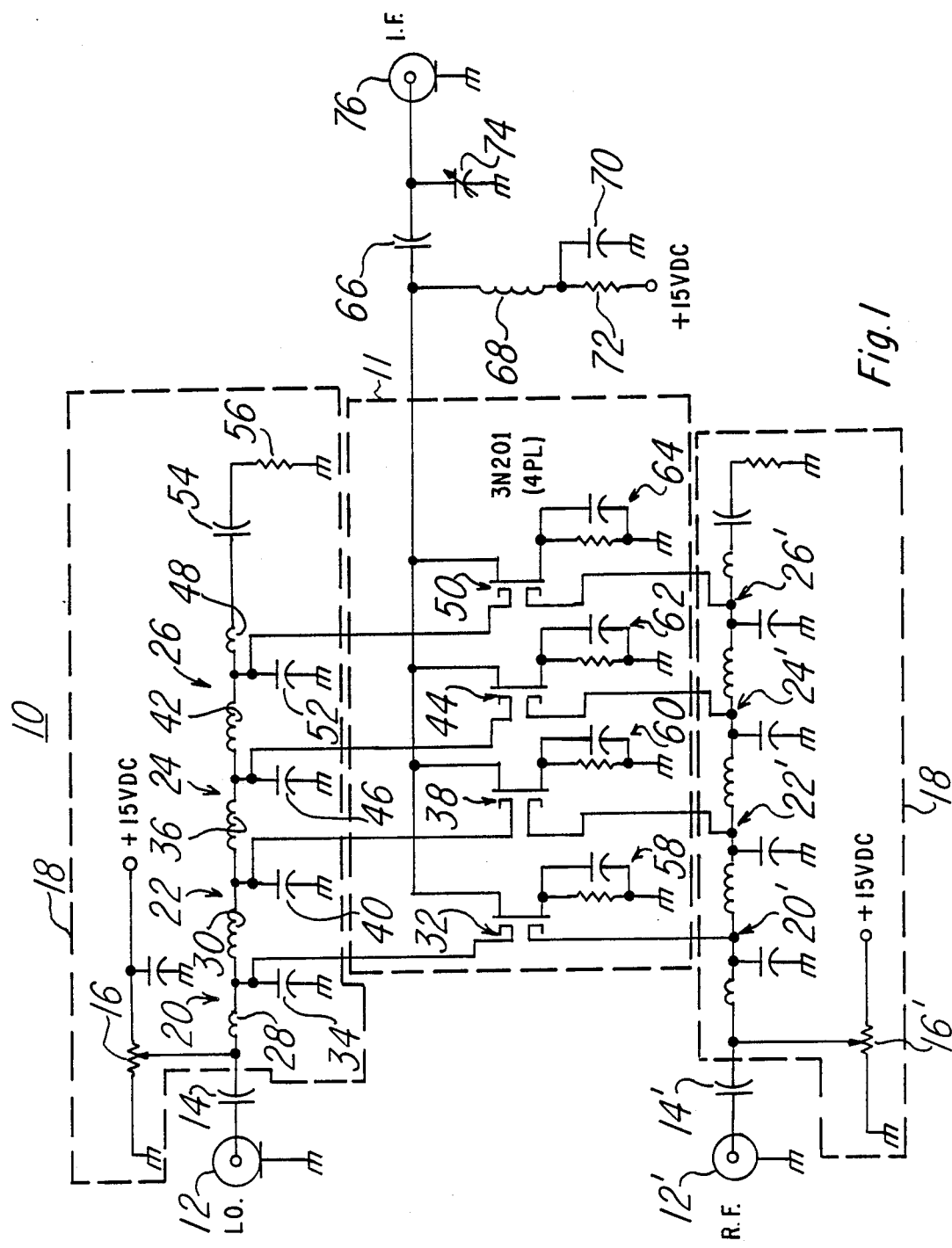
FIG. 1 is a schematic view of the monolithic distributed mixer constituting the subject matter of the invention.

Referring now to FIG. 1, the monolithic distributed mixer 10 includes a LO circuit and a RF circuit operatively connected to a mixer 11 for combining the incoming RF signal with the LO signal to produce an IF signal.

The LO circuit includes a coaxial cable connector 12 for connection to a LO (not shown) for receiving LO signals at a preselected frequency f1. A coupling capacitor 14 has a first plate connected to LO connector 12 and a second plate connected to the junction of a dc power supply potentiometer 16 and a lumped element transmission line 18.

The lumped element transmission line 18 includes a plurality of series connected T shaped constant K filter circuits 20, 22, 24 and 26 for delaying in time the application of the LO voltages at each of a plurality of dual gate FETs 32, 38, 44 and 50. The K constant filter circuit 20 includes an inductor 28 having a first terminal connected to the junction of the second plate of the coupling capacitor 14 and dc power supply potentiometer 16 and a second terminal connected to the junction of a first terminal of an inductor 30 and the junction of a first gate of a dual gate FET 32 and ground capacitor 34. Inductor 30 has its second terminal connected to the junction of the first terminal of inductor 36 and junction of a first gate of a dual gate FET 38 and ground capacitor 40. Similarly, the second terminal of inductor 36 is connected to the first terminal of inductor 42 and the junction of a first gate of a dual gate FET 44 and ground capacitor 46. While the second terminal of inductor 42 is connected to the junction of the first terminal of inductor 48 and junction of a first gate of FET 50 and ground capacitor 52. Finally, the second terminal of inductor 48 is connected to a capacitor 54 and the capacitor 54 is connected to ground through resistor 56.

The RF circuit is identical in construction to that of the LO circuit except that the T shaped constant K-filters 20', 22', 24', and 26' are connected to the second gates of dual gate FETs 32, 38, 44 and 50, and the coaxial input terminal is connected to an RF source.

The sources of dual gate FETs 32, 38, 44 and 50 are connected to ground through RC circuits 58, 60, 62 and 64; while their drains are commonly connected to the junction of the first plate of a capacitor 66 and first terminal of inductor 68. The second terminal of inductor 68 is connected to the junction of a grounded capcitor 70 and first terminal of a resistor 72. Resistor 72 has its second terminal connected to the dc power supply. While the second plate of capacitor 66 is connected to the junction of a grounded variable capacitor 74 and IF coaxial cable output terminal 76.

By employing the above described distributed structure having a lumped equivalent transmission line coupled to several active devices the input impedance can be held constant over very large bandwidths until the cutoff frequency of the structure is reached. The transmission line network is in part realized by employing the input capacitance of the active devices as the shunt reactance. When the active devices are dual gate FETs a similar structure is used to couple energy to a second gate thereof to establish a second broadband port. Either port can be used for LO (f1) injection with the remaining port used for RF (f2).

In operation, the phase shift, as a function of frequency, is the same at each section 20, 22, 24 and 26 of transmission lines 18 and 18′ and the phase difference between the LO frequency(f1) and the RF (f2) at each active device (dual gate FETs 32, 38, 44 and 50) are equal. Thus, the IF energy developed at each drain is in phase and can be summed with a simple impedance matching network such as, for example, a quarter wavelength matching transformer.

Figure 2:
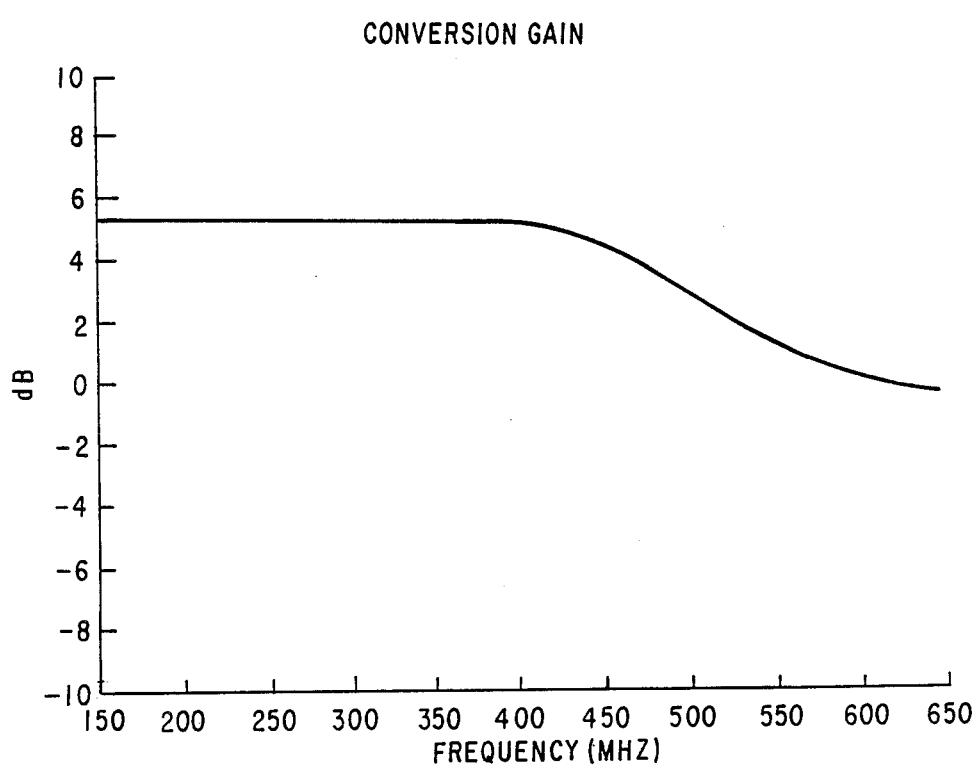
FIG. 2 is a chart showing the conversion gain of the distributed mixer of FIG. 1.
Figures 3A, 3B:
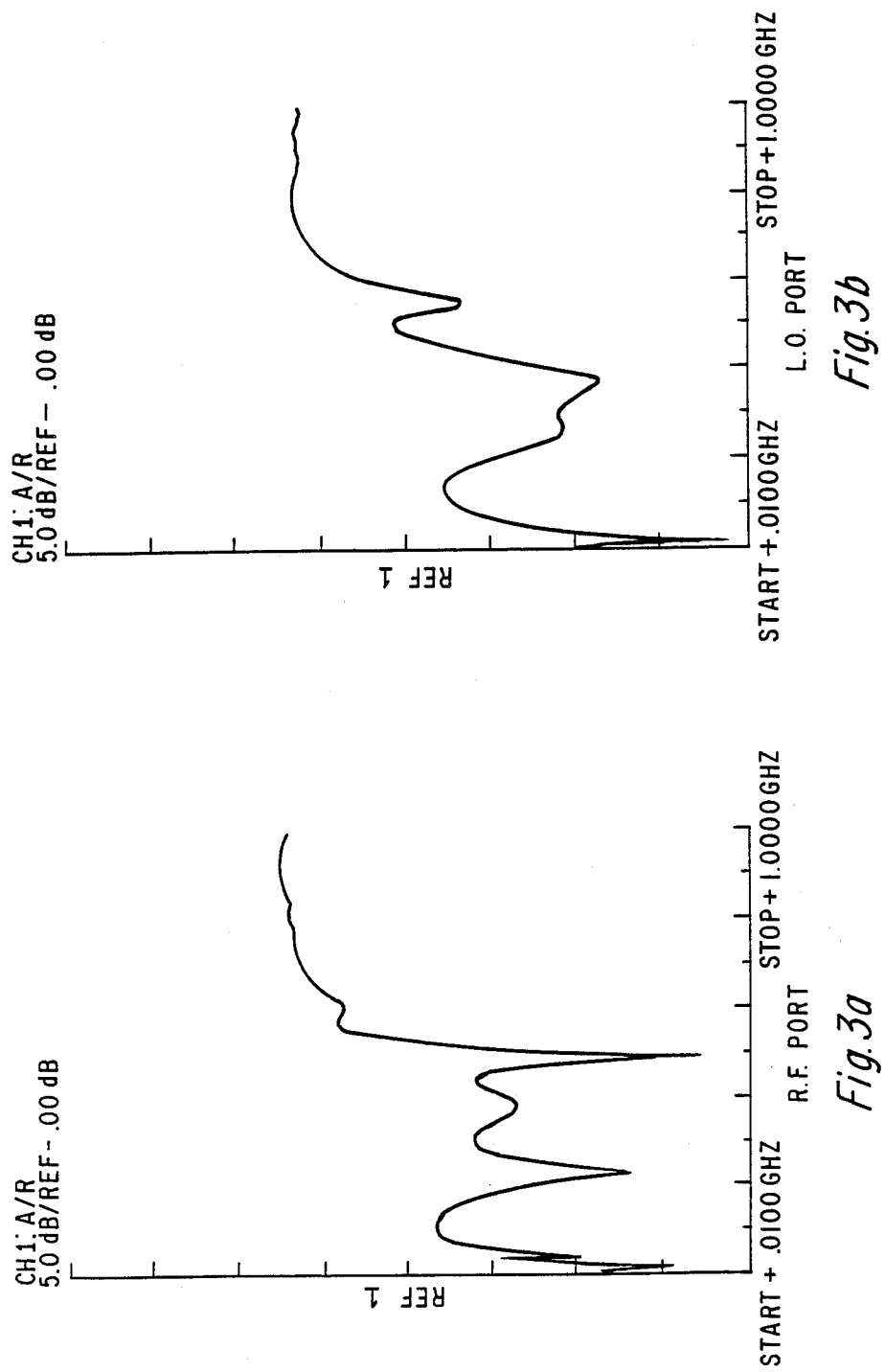
FIGS. 3a and 3b are charts showing, respectively, the VSWRs for the RF adn LO ports of the monolithic distributed mixer of FIG. 1.

A lumped element frequency scaled design of the monolithic distributed mixer (Fig.1) has been constructed and tested. The circuit (FIG. 1) exhibited excellent bandwidth, conversion gain, and low input VSWR. As calculated, the frequency response was limited by the cutoff frequency of each dual gate FET and the cut off (corner) frequency of the lumped element transmission lines (equivalent to a low pass filter). THe conversion gain and VSWR are shown in FIGS. 2 and 3.

Although a single embodiment of this invention as been described, it will be apparent to a person skilled in the art that various modifications to the details of construction shown and described may be made without departing from the scope of this invention.

What is claimed is:

1. A microwave mixer comprising:
   a first transmission line having a first plurality of distributed lumped element impedance means connected in series with each single lumped element impedance means including a first delay means for time delaying a first signal's propagation therethrough;
   a second transmission line having a second plurality of distributed lumped element impedance means connected in series with each single lump element impedance means including a second delay means for time delaying a second signal's propagation therethrough; and
   a mixer means including a plurality of active devices with each single active devices being operatively connected between a first predetermined distributed lumped element impedance means of the first plurality of distributed lumped elements impedance means and a second predetermined distributed lumped element impedance means of the second plurality of distributed lumped element impedance means, the mixer means being for mixing the time delayed first signal and the time delayed second signal to produce a third signal and each single active device of the plurality of active devices being a dual gate FET having a first gate and a second gate with the operative connection including a first connection between the first gate and the first predetermined distributed lumped element impedance means and a second connection being between the second gate and the second predetermined lumped element impedance means.

2. The microwave mixer according to claim 1, wherein each single lumped element impedance means of the first and second plurality of distributed lumped element impedance means comprises:
   a T shaped filter.

3. The microwave mixer according to claim 1 wherein the each single dual gate FET has a drain connected to an output of the mixer means at which the third signal is provided.

4. A microwave mixer comprising:
   a plurality of dual gate FETs with each single FET having a first gate, a second gate, a source and a drain;
   a first transmission line comprising;
      a first input terminal for receiving a first signal, a plurality of serially connected T shaped filters with each single T shaped filter including a first inductor, a second inductor and a grounded capacitor having a first plate connected to a ground and a second plate, the first inductor being connected to the second inductor at a junction and the junction being also connected to the first gate of a predetermined dual gate FET of the plurality of dual gate FETs and to the second plate of the grounded capacitor, a line termination of a series connection of a capacitor, a resistor and ground, and the plurality of T shaped filters being serially connected between the second inductor of a preceding T shaped filter and the first inductor of a succeeding T shaped filter from a first T shape filter to a last T shaped filter with the first T shaped filter being connected to the first input terminal via its first inductor and the last T shaped filter being connected to the line termination via its second inductor; and a second transmission line comprising;
      a second input terminal for receiving a second signal, a second plurality of T shaped filters with each single T shaped filter of the second plurality of T shaped filters including a first inductor, a second inductor and a grounded capacitor having a first plate and a second plate with the first plate connected to a ground, the first inductor being connected to the second inductor at a junction and the junction being also connected to the second gate of a predetermined dual gate FET of the plurality of dual gate FETs and to the second plate of the grounded capacitor, a second line termination of a series connected capacitor, resistor, and ground, and the second plurality of T shaped filters being serially connected between the second inductor of a preceding T shaped filter and the first inductor of a succeeding T shaped filter from a first T shape filter to a last T shaped filter with the first T shaped filter being connected to the second input terminal via its first inductor and the last T shaped filter being connected to the second line termination via its second inductor;
   a plurality of RC circuits;
   each single dual gate FET has its source connected through a single RC circuit of the plurality of RC circuits to ground and the drains of the plurality of dual gate FETs being commonly connected whereby a phase shift at the first gate of the predetermined dual gate FET is the same as a phase shift at the second gate of the predetermined dual gate FET.

5. The microwave mixer according to claim 4 wherein the elements thereof are contained in a GaAs substrate.

* * * * *